United States Patent [19]
Togawa et al.

[11] Patent Number: 5,944,941
[45] Date of Patent: Aug. 31, 1999

[54] TURNING-OVER MACHINE AND POLISHING APPARATUS

[75] Inventors: Tetsuji Togawa; Kuniaki Yamaguchi, both of Kanagawa-ken, Japan

[73] Assignee: EBARA Corporation, Tokyo, Japan

[21] Appl. No.: 08/947,856

[22] Filed: Oct. 9, 1997

[30] Foreign Application Priority Data

Oct. 9, 1996 [JP] Japan .................................. 8-289211

[51] Int. Cl.$^6$ .................................................. H01L 21/00
[52] U.S. Cl. ............................ 156/345; 216/88; 438/691
[58] Field of Search ...................... 156/345 LP; 216/88, 216/89; 438/690, 691, 692, 693, 745, 959; 451/66, 67, 289, 290, 334

[56] References Cited

U.S. PATENT DOCUMENTS

| | | |
|---|---|---|
| 4,950,392 | 8/1990 | Tiegs et al. . |
| 5,316,620 | 5/1994 | Hasegawa et al. ................. 156/345 X |
| 5,518,542 | 5/1996 | Matsukawa et al. . |
| 5,618,227 | 4/1997 | Tsutsumi et al. . |

FOREIGN PATENT DOCUMENTS 0 065 861   12/1982   European Pat. Off. .

OTHER PUBLICATIONS

Patent Abstracts of Japan, vol. 009, No. 230 (E–343), Sep. 17, 1985 & JP 60 084823 A (Mitsubishi Denki KK), May 14, 1985 * abstract *.

Patent Abstracts of Japan, vol. 096, No. 010, Oct. 31, 1996 & JP 08 153697 A (Toshiba Mach Co Ltd; Toshiba Corp) Jun. 11, 1996 * abstract *.

*Primary Examiner*—William Powell
*Attorney, Agent, or Firm*—Wenderoth, LInd & Ponack, LLP

[57] ABSTRACT

The present invention provides a dry/wet work turning-over machine which can be used with both a dry hand and a wet hand and in which, even when the dry hand having a vacuum suction mechanism is inserted into a water-proof cover surrounding a work turning-over device, liquid is not adhered to the hand. In the dry/wet work turning-over machine, the work turning-over device is surrounded by the water-proof cover. An opening is formed in the water-proof cover at an upper surface of a front side thereof and a front part of an upper surface thereof. A screen for closing the opening is attached to the opening. The screen is rotated in a downward direction by a rotation driving mechanism.

11 Claims, 11 Drawing Sheets

TURNING-OVER MACHINE AND POLISHING APPARATUS

BACKGROUND OF THE INVENTION

The present invention relates to a work turning-over machine, and more particularly, it relates to a dry/wet work turning-over machine used for turning over both dry work and wet work, and a polishing apparatus utilizing such a dry/wet work turning-over machine.

Prior Arts

In the manufacture of semi-conductor wafers, a polishing apparatus has been used for polishing a surface of a semi-conductor wafer to a mirror-surface finish.

FIG. 10 is a schematic plan view showing an internal structure of a polishing apparatus proposed by the Applicant. As shown in FIG. 10, the polishing apparatus is constituted of a polishing portion 130 and a cleaning portion 150.

The polishing portion 130 includes a top ring unit 137 to which a top ring 135 is attached, a dressing unit 141 to which a dressing tool 139 is attached, and a work transferring device 143. The units 137 and 141 are disposed on both sides of a turn table 133.

The cleaning portion 150 includes two central conveying robots 151, 153 shiftable in a directions shown by the double-headed arrow Z. A first cleaner 155, a second cleaner 157 and a spin drier (or spin drier having a cleaning function) 159 are disposed side by side at one side of the robots, and a wet work turning-over machine 161 and a dry work turning-over machine 163 are disposed side by side at the other side of the robots.

FIG. 11 is a perspective view showing an internal structure of the cleaning portion 150 in detail. As shown in FIG. 11, the wet work turning-over machine 161 is surrounded by a liquid scatter preventing water-proof cover 171.

Each of the conveying robots 151, 153 has two sets of arm mechanisms 154 attached to an upper surface thereof. Hands 255, 256 and 257, 258 for holding a semi-conductor wafer, respectively, are attached to tip (free) ends of the arm mechanisms 154. The hands 255 and 256 overlap in an up-and-down direction, and the hands 257 and 258 also overlap in an up-and-down direction.

The three hands 255, 256, 258 are hands of type in which the semi-conductor wafer can rest on each of the hands, and the other hand 257 is a hand of type having a vacuum suction mechanism for holding the semi-conductor wafer on the hand by vacuum suction.

Operation of the entire polishing apparatus will now be explained with reference to FIGS. 10 and 11. When a cassette 165 containing a plurality of semi-conductor wafers (before polished) is set at a position as shown in FIG. 10, the hand 257 of the conveying robot 153 picks up a single semi-conductor wafer from the cassette 165 and transfers the wafer to the work turning-over machine 163 where the wafer is turned over. Thereafter, the semi-conductor wafer is transferred from the work turning-over machine 163 to the hand 255 of the conveying robot 151 and then is conveyed to the work transferring device 143 (FIG. 10) of the polishing portion 130.

The semi-conductor wafer on the work transferring device 143 is transferred onto the turn table 133 while being held by a lower surface of the top ring 135 of the top ring unit 137 moved in a direction P. The semi-conductor wafer is polished by a polishing surface 134 of the rotating turn table 133. In this case, a polishing pad as the polishing surface is attached onto the upper surface of the turn table 133, and an abrasive liquid is supplied from a supply tube (not shown) onto the polishing surface 134.

After polishing, the semi-conductor wafer is returned to the work transferring device 143 and is then transferred to the work turning-over machine 161 via the hand 256 (FIG. 11) of the conveying robot 151. After the semi-conductor wafer is turned over while being rinsed with a rinse liquid, the semi-conductor wafer is transferred, by the hand 256, to the first cleaner 155, where the wafer is cleaned. Then, the semi-conductor wafer is transferred, by the hand 256, to the second cleaner 157, where the wafer is further cleaned. Then, the semi-conductor wafer is transferred, by the hand 258, to the spin drier 159, where the wafer is spin-dried. Thereafter, the semi-conductor wafer is returned to the same cassette 165 by the hand 257. The semi-conductor wafer is rinsed at the work turning-over machine 161 so as to prevent the semi-conductor wafer to which the abrasive liquid is adhered from becoming dry.

Incidentally, the dressing unit 141 shown in FIG. 10 is appropriately shifted onto the turn table 133 as shown by the arrow R, so that the rotating polishing surface 134 is refreshed and conditioned by the rotating dressing tool 139.

(Problems which the Invention is to Solve)

Two work turning-over machines 161, 163 are provided in the conventional polishing apparatus and thus the hand 257 having the vacuum suction mechanism cannot be used with the wet work turning-over machine 161. This will now be described concretely.

That is to say, as is in the above-mentioned polishing apparatus, the wet work turning-over machine 161 for turning over the semi-conductor wafer while rinsing it is surrounded by the water-proof cover 171 (FIG. 11) to prevent the rinse liquid from scattering therearound.

FIG. 12 is a schematic sectional view of the conventional water-proof cover 171. As shown in FIG. 12, the water-proof cover 171 is so shaped as to surround the work turning-over machine 161 completely and is provided at its front surface with an opening 175 for insertion of the wet hand 256, and a shutter 177 for opening and closing the opening 175 is disposed inside of the opening 175 for sliding movement in the up-and-down direction.

After the shutter 177 is released to open the opening 175, the hand 256 is inserted into the cover 171 through the opening 175 to transfer the semi-conductor wafer to the work turning-over machine 161. Thereafter, the hand 256 is retracted and the shutter 177 is closed. In this condition, the semi-conductor wafer is turned over while the wafer is rinsed with rinse liquid to prevent the wafer from becoming dry. Then, after the supply of the rinse liquid is stopped, the shutter 177 is opened and the semi-conductor wafer is removed from the work turning-over machine 161 by the hand 256.

If the hand 257 having the vacuum suction mechanism can transfer the dry semi-conductor wafer picked up from the cassette 165 to the wet work turning-over machine 161, the dry work turning-over machine 163 can be omitted. This is Desirable.

However, if the hand 257 having the vacuum suction mechanism is inserted into the water-proof cover 171 to transfer the semi-conductor wafer to the work turning-over machine 161, the rinse liquid (scattered within the water-proof cover 171 during the rinsing operation and) adhered to an upper inner surface of the water-proof cover 171 and an upper portion of the opening 175 will drop onto the hand 257 as liquid droplets. In this case, the liquid droplets adhered to the surface of the hand 257 are sucked into a vacuum line through vacuum suction holes of the hand 257 to cause malfunctioning of the vacuum suction mechanism.

Thus, when the hand 257 having the vacuum suction mechanism is used, the dry work turning-over machine 163 having no rinsing mechanism is required additionally. Incidentally, in view of design limitation, the picking-up and returning of the semi-conductor wafer with respect to the cassette 165 cannot be performed by any hands other than the hand 257 having the vacuum suction mechanism.

SUMMARY OF THE INVENTION

The present invention aims to eliminate the above-mentioned conventional drawbacks, and an object of the present invention is to provide a dry/wet work turning-over machine and a polishing apparatus, in which, even when a hand having a vacuum suction mechanism is inserted into a water-proof cover surrounding the work turning-over machine, rinse liquid does not adhere to the hand, thereby permitting the hand to be used in both dry and wet state. (Means for Solving the Problems)

To achieve the above object, according to the present invention, there is provided a work turning-over machine in which work can be transferred between a work turning-over device and a hand of a robot for holding the work at its upper surface and the work is turned over by the work turning-over device, and wherein the work turning-over device is surrounded by a water-proof cover for preventing scattering of liquid, the water-proof cover being provided with an upper opening mechanism so that, when the hand is inserted into the water-proof cover, at least an area immediately above a portion not covered by the work is opened, thereby preventing liquid droplets adhering to an inner surface of the water-proof cover from dropping onto the hand of the robot.

DETAILED DESCRIPTION OF THE PREFERRED EMBODIMENTS

The present invention will now be explained in connection with embodiments thereof with reference to the accompanying drawings.
First Embodiment FIG. 1 is a view showing a dry/wet work turning-over machine 10 according to a first embodiment of the present invention, where FIG. 1(*a*) is a front view of the dry/wet work turning-over machine and FIG. 1(*b*) is a sectional view taken along the line A—A in FIG. 1(*a*).

Figure 1:
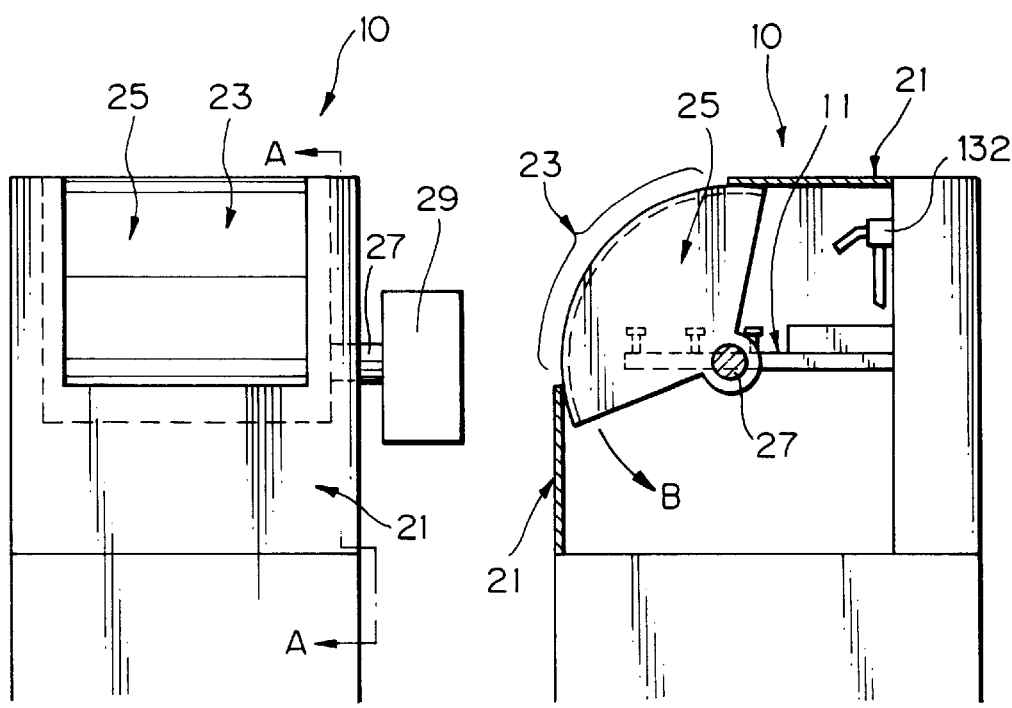
FIG. 1 is a view showing a dry/wet work turning-over machine according to a first embodiment of the present invention, where FIG. 1(*a*) is a front view of the dry/wet work turning-over machine and FIG. 1(*b*) is a sectional view taken along the line A—A in FIG. 1(*a*).

As shown in FIG. 1, in the dry/wet work turning-over machine 10, a work turning-over device 11 for gripping a semi-conductor wafer and for turning over the gripped semi-conductor is surrounded by a water-proof cover 21 for preventing liquid from being scattered therearound.

In the illustrated embodiment, an opening 23 is formed in the water-proof cover 21 at an upper part of a front surface thereof and a front part of an upper surface thereof, and a substantially semi-cylindrical screen 25 is provided to close and open the opening 23. The opening 23 and the screen 25 constitute an upper opening mechanism.

The screen 25 has a rotary shaft 27 protruding from its side surface, and a rotation driving mechanism (opening/closing means) 29 is attached to the rotary shaft. The rotation driving mechanism 29 serves to rotate the screen 25 from a position shown in FIG. 1 toward a leftward and downward direction (direction shown by the arrow B).

Rinse liquid supplying means 132 for supplying a rinse liquid to the semi-conductor wafer gripped by the work turning-over device 11 are provided within the water-proof cover 21.

In this embodiment, a rinse liquid is supplied to the both sides of the semi-conductor wafer by the two rinse liquid supplying means 132, which are provided above and below the work turning-over device 11, respectively. Although not shown in the drawings, a duct means for exhausting the inner air of the water-proof cover 21 downwardly, is provided in the lower portion of the dry/wet work turning-over machine 10, so that the mist produced by rinsing liquid to the semi-conductor wafer does not disperse into the air out of the turning-over machine 10.

Figure 10:
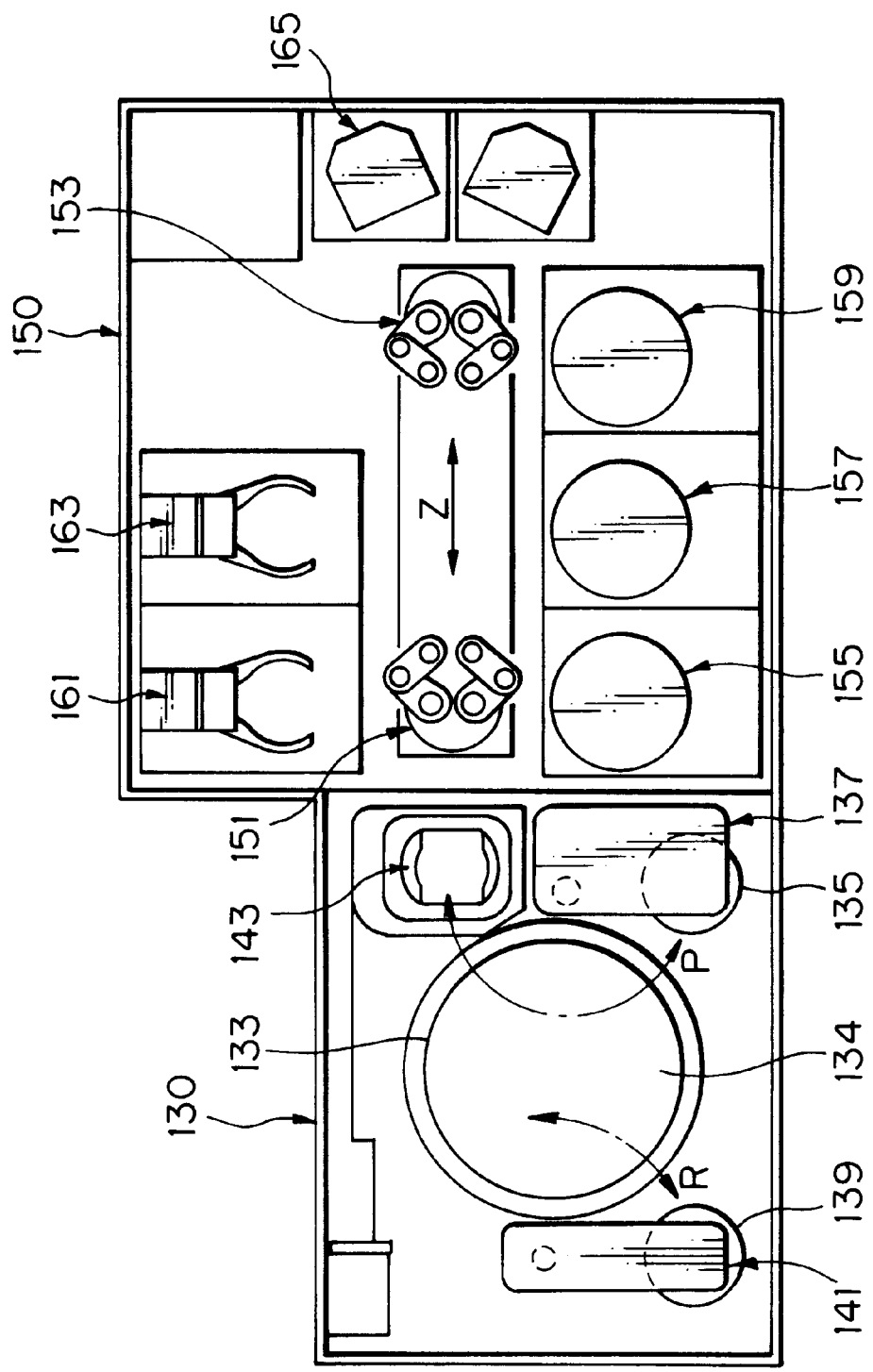
FIG. 10 is a schematic plan view showing an internal structure of a polishing apparatus proposed by the Applicant.

The dry/wet work turning-over machine 10 can act both as a dry work turning-over machine and as a wet work turning-over machine, and, thus, in comparison with the conventional polishing apparatus shown in FIG. 10, two work turning-over machines 161, 163 can be replaced by the dry/wet work turning-over machine 10 according to the first embodiment of the present invention. Now, an operation of the dry/wet work turning-over machine 10 (FIG. 1) is used in the polishing apparatus shown in FIG. 10 (in place of the two work turning-over machines 161, 163) will be described.

Figure 11:
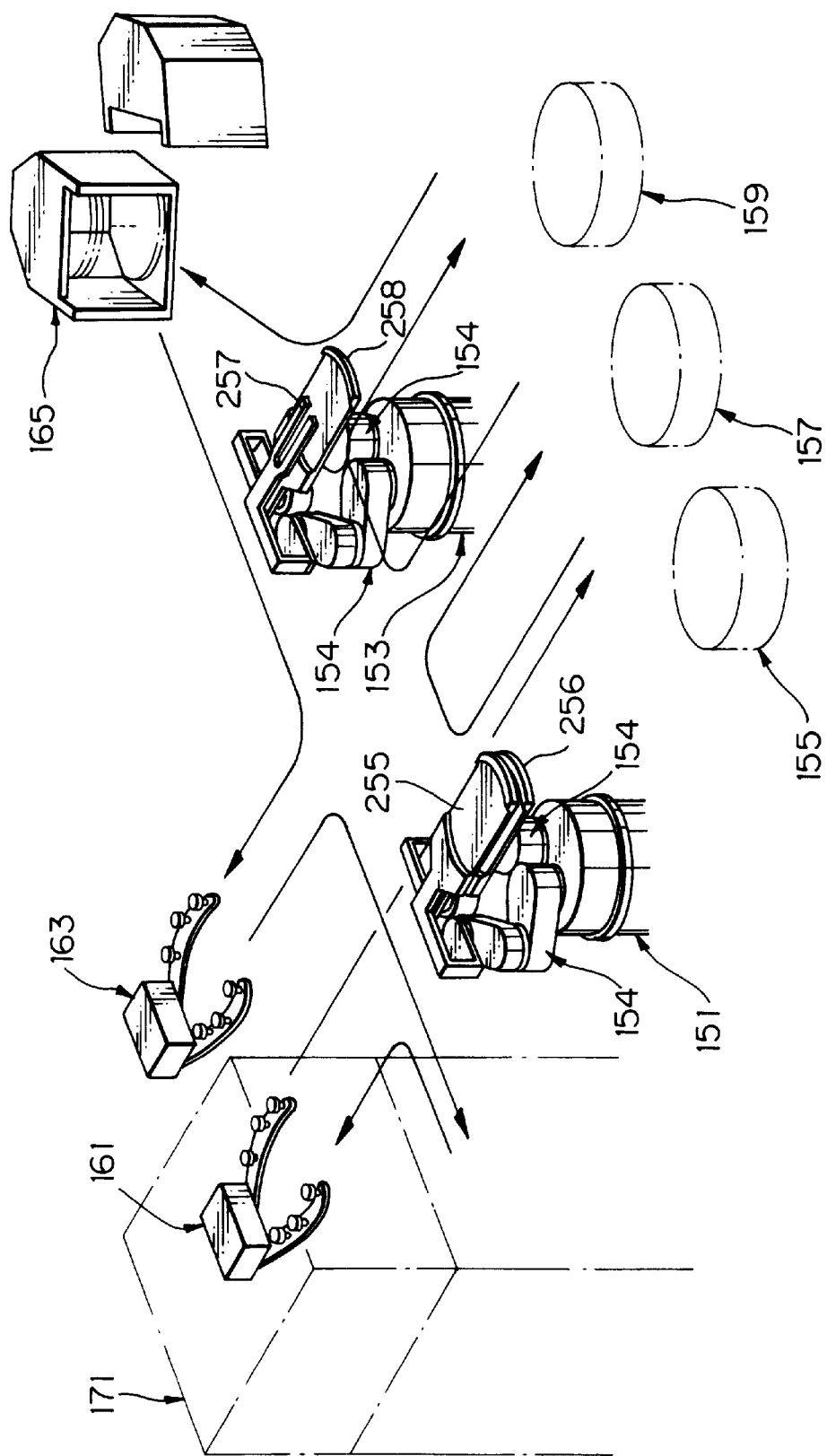
FIG. 11 is a perspective view showing an internal structure of a cleaning portion 150 in detail.
Figure 12:
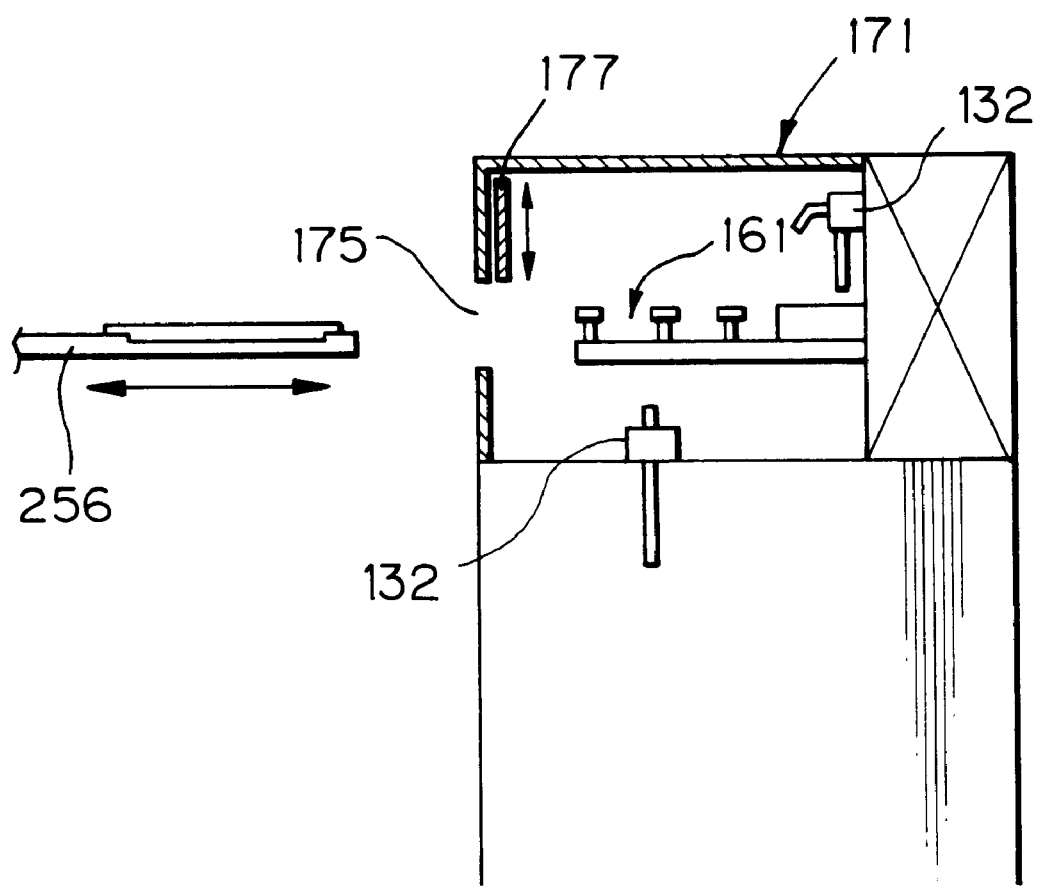
FIG. 12 is a schematic side sectional view of a conventional water-proof cover 171.

The semi-conductor wafer polished at the polishing portion 130 is transferred to the dry/wet work turning-over machine 10 by the wet hand 256 (refer to FIG. 11). Then, after the hand 256 is retracted, the screen 25 is closed. In this condition, the semi-conductor wafer is rinsed while being turned over. In this case, the rinse liquid is scattered within the water-proof cover 21 to form liquid droplets adhered to the entire inner surface of the water-proof cover.

Figure 2:
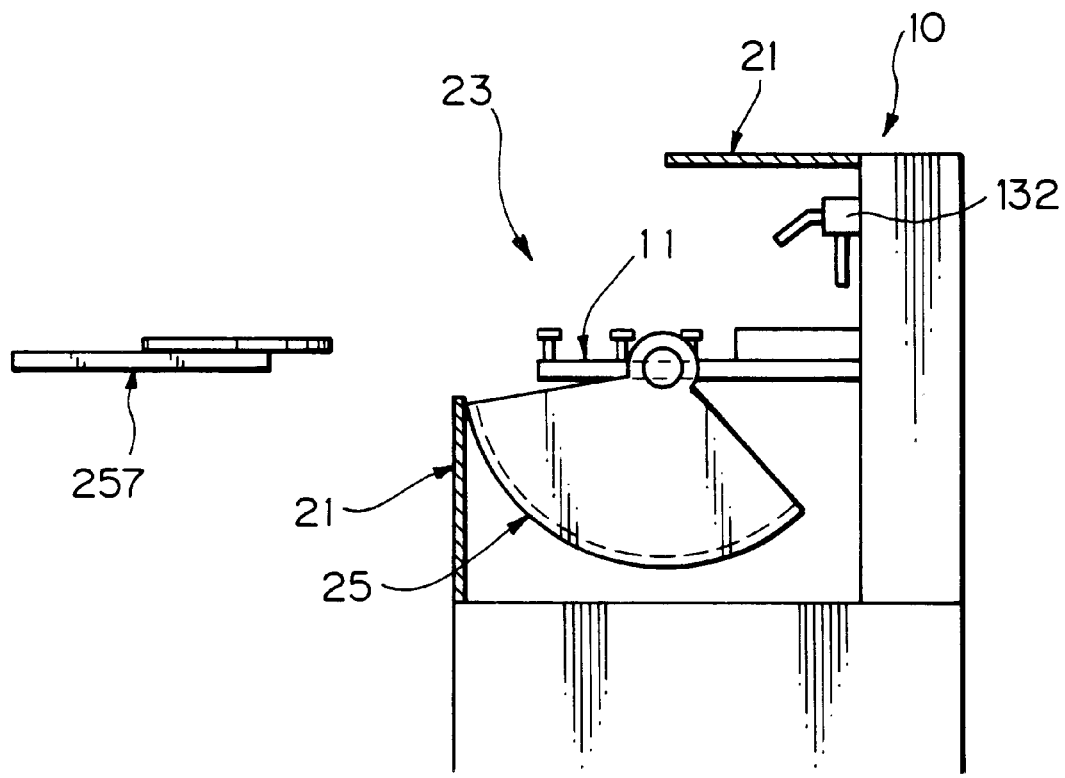
FIG. 2 is an explanatory view for explaining an operation of the dry/wet work turning-over machine 10.

Then, when the screen 25 is rotated in the downward direction (direction B) by driving the rotation driving mechanism 29, as shown in FIG. 2, the screen 25 is shifted below the work turning-over device 11 to open the opening 23. The semi-conductor wafer is removed from the work turning-over device 11 by inserting the wet hand 256 (refer to FIG. 11) through the opening 23.

Then, the dry hand 257 holding the semi-conductor wafer (before polished) picked up from the cassette 165 is inserted through the opening 23 of the dry/wet work turning-over machine 10 to transfer the wafer to the work turning-over device 11.

In this case, since an area above the opening 23 has no wall portion of the water-proof cover because of downward rotation of the screen 25, the rinse liquid droplets adhered to the inner surfaces of the water-proof cover 21 and the screen 25 do not drop onto the dry hand 257. Therefore, there is no danger of damaging the vacuum suction mechanism of the hand 257.

Figure 3:
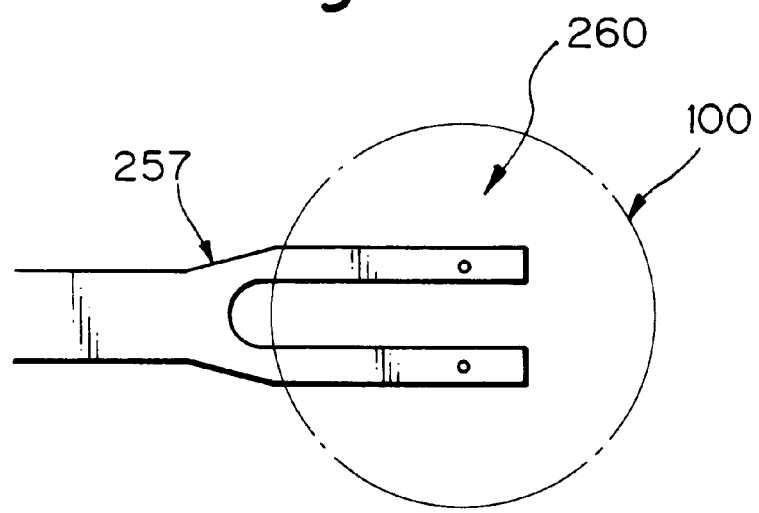
FIG. 3 is a view showing a condition that a semi-conductor wafer 100 is held on a dry hand 257 by vacuum suction.

Incidentally, as shown in FIG. 3, since the dry hand 257 which holds the semi-conductor wafer 100 with its vacuum suction holes 260 by a vacuum is inserted into the water-proof cover 21, the rinse liquid dropping onto the semi-conductor wafer 100 does not reach the hand 257. Thus, the dimension of the opening 23 may be reduced accordingly.

Figure 6A:
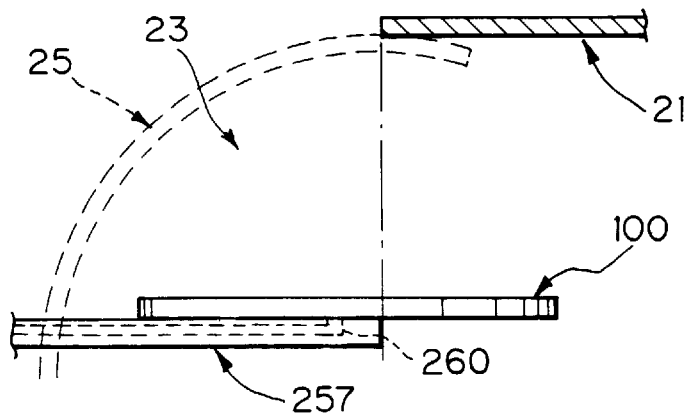
FIG. 6 is a view showing a relation between a water-proof cover 21 and a hand 257, where FIG. 6(*a*), FIG. 6(*b*) and FIG. 6(*c*) show comparison of insertion positions of the hand into the water-proof cover.

FIG. 6 shows a comparison in positions between the water-proof cover 21 and the hand 257. As shown in FIG. 6(a), when an insertion position of the hand 257 into the water-proof cover 21 is selected so that the entire hand 257 including the vacuum suction holes is positioned within the opening 23, the rinse liquid does not drop onto the hand 257 regardless of presence/absence of the semi-conductor wafer 100 on the hand 257. This is the most safe condition. However, with this arrangement, the semi-conductor wafer 100 cannot be inserted into the water-proof cover 21 deeply.

Figure 6B:
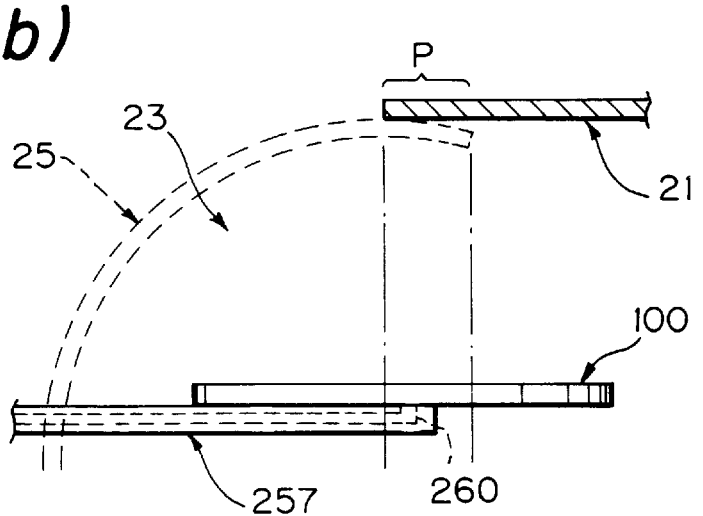

To avoid this, as shown in FIG. 6(b), it may be designed so that, when the opening 23 is closed by the screen 25, an upper end portion of the screen 25 enters into the water-proof cover 21 to provide an overlap portion P, and, when the hand 257 is inserted into the opening 23 opened by the downward rotation of the screen 25, the hand 257 is inserted in such a manner that a tip end (free end) and the vacuum suction holes of the hand 257 reaches a position immediately below the overlap portion P.

Since a part of the water-proof cover 21 at the overlap portion P is covered by the screen 25 during the rinsing operation, the rinse liquid is not adhered to that part after the screen 25 is opened. Thus, even when the hand 257 enters below the overlap portion P, as indicated in FIG. 6(b), the rinse liquid does not drop onto the hand from the overlap portion P of the water-proof cover 21. Accordingly, the rinse liquid does not drop onto the hand 257 regardless of the presence/absence of the semi-conductor wafer 100 on the hand 257. This is also a safe condition. Further, in this case, since the semi-conductor wafer 100 can be inserted into the water-proof cover 21 relatively deeply, the water-proof mechanism can be made compact accordingly.

Incidentally, by increasing the length of the overlap portion P, the semi-conductor wafer 100 can be inserted into the water-proof cover 21 further deeply.

Figure 6C:
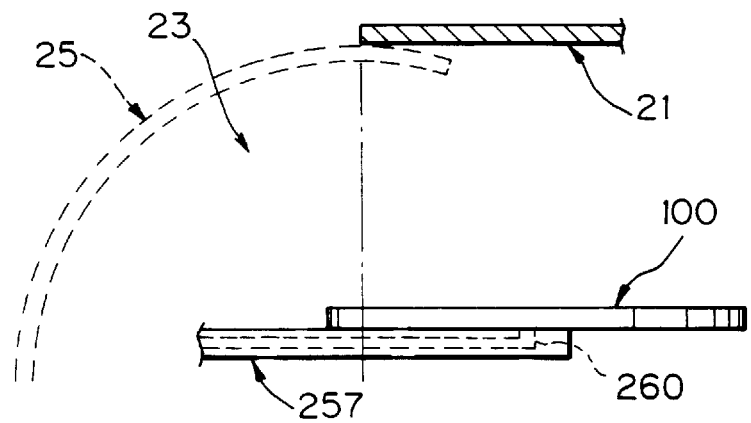

Although the above-mentioned arrangements are desirable in consideration of safety, when safety is not critical, as shown in FIG. 6(c), the hand 257 may be inserted so that only a portion of the hand on which the semi-conductor wafer 100 is not resting is positioned within the opening 23.

Since the semi-conductor wafer 100 rests on the hand 257, even if the rinse liquid drops from the water-proof cover 21, the rinse liquid merely drops onto the semi-conductor wafer 100 and does not reach the vacuum suction holes of the underlying hand 257.

Namely, in the present invention, it is not necessary for the entire area immediately above the entire upper surface of the hand 257 inserted into the water-proof cover 21 to be opened or clear, but at least an area immediately above the shift range through which the part of the hand 257 on which the semi-conductor wafer 100 is not rested is moved may be opened or clear. More preferably, it may be designed so that the tip end of the inserted hand 257 reaches the position immediately below the overlap portion P (between the screen 25 and the water-proof cover 21).

Figure 13A:
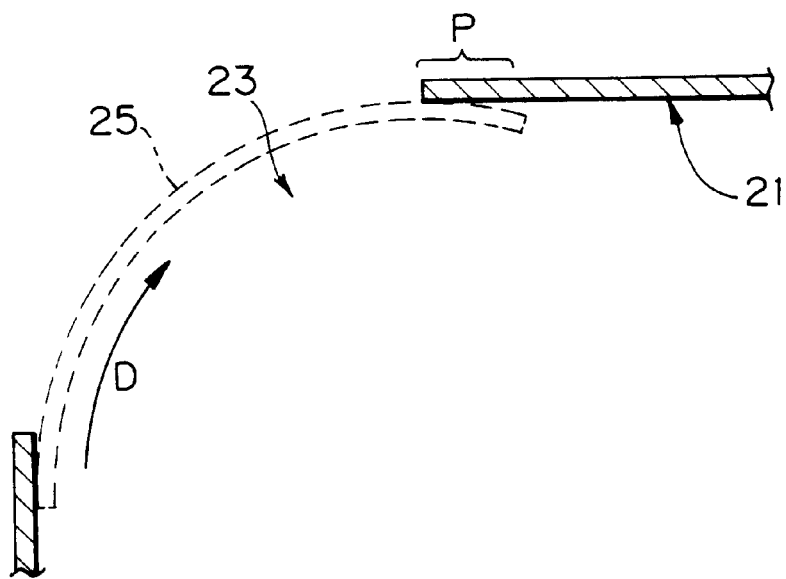
FIG. 13 is a view for explaining another method for shifting a screen 25 according to the first embodiment, where FIG. 13(*a*) shows a certain stage and FIG. 13(*b*) shows another stage.

In the illustrated embodiment, while an example that, when the opening 23 is opened by opening the screen 25, the screen 25 is shifted toward the direction B in FIG. 2(b) was explained, as shown in FIG. 13(a), the opening 23 may be opened by shifting the screen 25 in a direction D opposite to the direction B.

In this case, as shown in FIG. 13(a), it is desirable that, when the opening 23 is closed by the screen 25, an upper end portion is partially overlapped with the water-proof cover 21 to provide an overlap portion P, thereby preventing the rinse liquid from adhering to the overlap portion P of the water-proof cover 21.

Figure 13B:
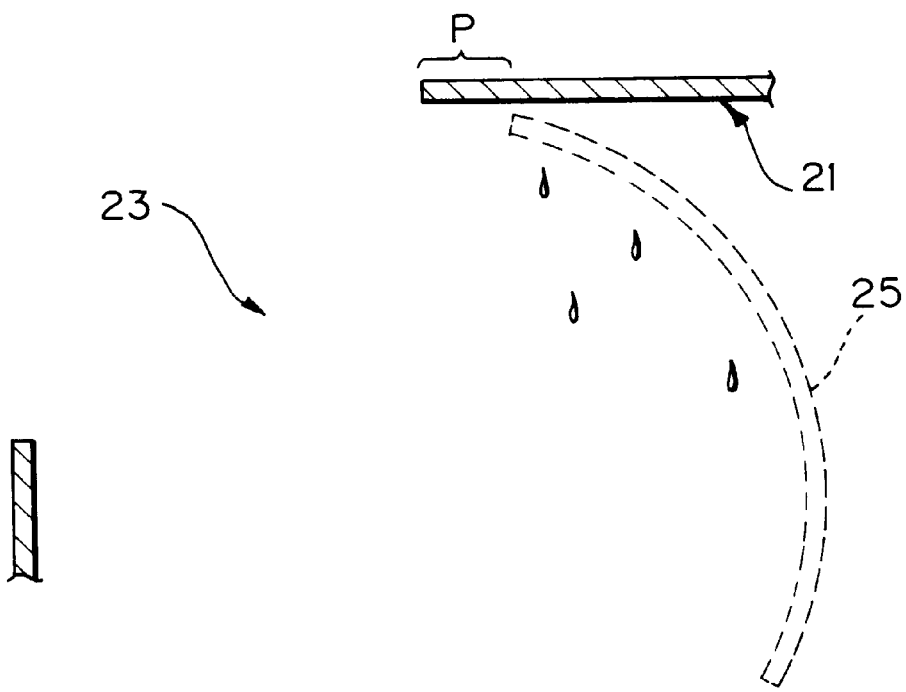

When the opening 23 is opened by shifting the screen 25 in the direction D at least up to a position where the screen 25 is not overlapped with the overlap portion P of the water-proof cover 21 as shown in FIG. 13(b), since the rinse liquid does not adhere to the overlap portion P of the water-proof cover 21 and the wetted screen 25 is not positioned at the position immediately below the overlap portion P, the same effect described in connection with FIG. 6(b) (i.e., the effect that the tip end of the hand 257 can be inserted up to the position immediately below the overlap portion P in the water-proof cover 21 to permit the deep insertion of the semi-conductor wafer 100, thereby making the water-proof mechanism more compact) can be achieved.

Second Embodiment

Figure 4A:
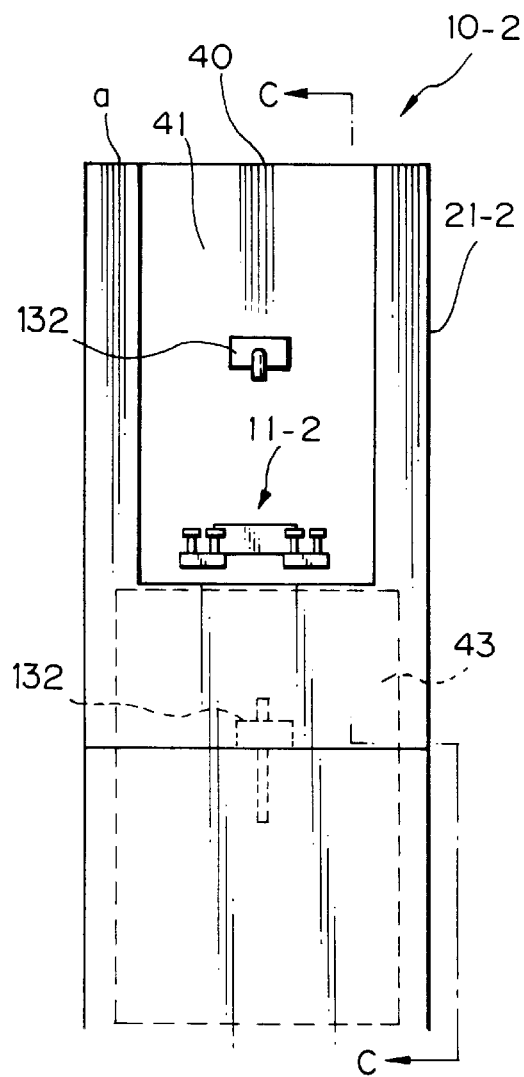
FIG. 4 is a view showing a dry/wet work turning-over machine according to a second embodiment of the present invention, where FIG. 4(*a*) is a front view of the dry/wet work turning-over machine and FIG. 4(*b*) is a sectional view taken along the line C—C in FIG. 4(*a*).
Figure 4B:
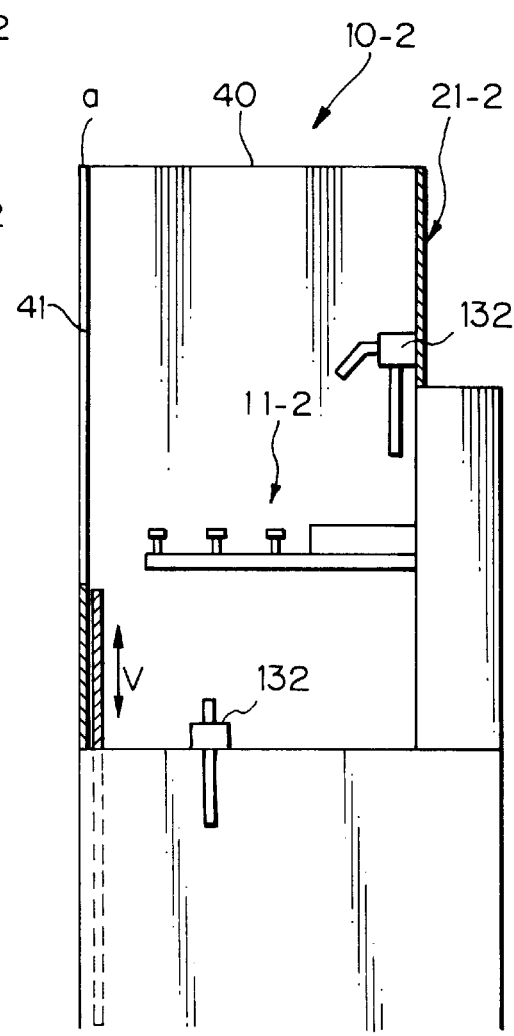

FIG. 4 is a view showing a dry/wet work turning-over machine according to a second embodiment of the present invention, where FIG. 4(a) is a front view of the dry/wet work turning-over machine and FIG. 4(b) is a sectional view taken along the line C—C in FIG. 4(a). As shown in FIG. 4, in the dry/wet work turning-over machine 10-2, a work turning-over device 11-2 is surrounded by a water-proof cover 21-2 for preventing liquid from scattering therearound.

The water-proof cover 21-2 according to this embodiment is formed from a longitudinal elongated cylindrical member having an upper opening 40, and a hand insertion portion 41 is constituted by a notch formed in a front side of the water-proof cover 21-2 at an upper part thereof reaching an upper edge a of the cover.

Below the hand insertion portion 41, a shield member 43 for opening and closing the hand insertion portion 41 is supported for sliding movement in an up-and-down direction (shown by the arrow V).

A rinse liquid supplying means 132 for supplying rinse liquid to the semi-conductor wafer gripped by the work turning-over device 11-2 is provided within the water-proof cover 21-2.

In this dry/wet work turning-over machine 10-2, for example, the semi-conductor wafer polished at the polishing portion 130 is transferred to the dry/wet work turning-over machine 10-2 by the wet hand 256 (refer to FIG. 11). Then, after the hand 256 is retracted, the hand insertion portion 41 is closed by lifting the shield member 43. In this condition, the semi-conductor wafer is rinsed while being turned over.

In this case, the rinse liquid is scattered within the water-proof cover 21-2 to form liquid droplets adhering to the entire inner surface of the water-proof cover. In this embodiment, although the water-proof cover 21-2 has the upper opening 40 at its top, since the upper opening 40 is positioned above and remote from the work turning-over device 11-2 due to the elongated cylindrical structure, the scattered rinse liquid does not reach the upper opening 40. Thus, there is no danger of scattering of the rinse liquid out of the cover.

Then, the hand insertion portion 41 is opened by lowering the shield member 43. The semi-conductor wafer is removed from the work turning-over device 11-2 by inserting the wet hand 256 through the hand insertion portion 41.

Then, the dry hand 257 holding the semi-conductor wafer (before polished) picked up from the cassette 165 shown in FIG. 11 is inserted through the hand insertion portion 41 to transfer the wafer to the work turning-over device 11-2.

In this case, since there is the upper opening 40 at the top of the water-proof cover 21-2 and the hand insertion portion 41 is constituted by the notch extending up to the top of the water-proof cover, an area immediately above the hand insertion portion 41 is opened or clear. Thus, the rinse liquid droplets adhering to the inner surfaces of the water-proof cover 21-2 and the shield member 43 do not drop onto the dry hand 257.

Incidentally, also in this embodiment, it is not necessary for providing an upper opening 40 which opens the entire area immediately above the entire upper surface of the hand 257, but the dimension of the upper opening 40 may be selected so as to clear at least an area immediately above the shift range through which the part of the hand 257 on which the semi-conductor wafer 100 is not rested is moved within the water-proof cover 21-2.

In the second embodiment, while an example that the shield member 43 is formed from a flat plate was explained, the shield member 43 may have one of various shapes. For example, the shield member may be formed from a cylindrical member for surrounding the work turning-over device 11-2. In this case, the work turning-over device 11-2 is dual-surrounded by the cylindrical shield member 43 and the water-proof cover 21-2.

Third Embodiment

Figure 5A:
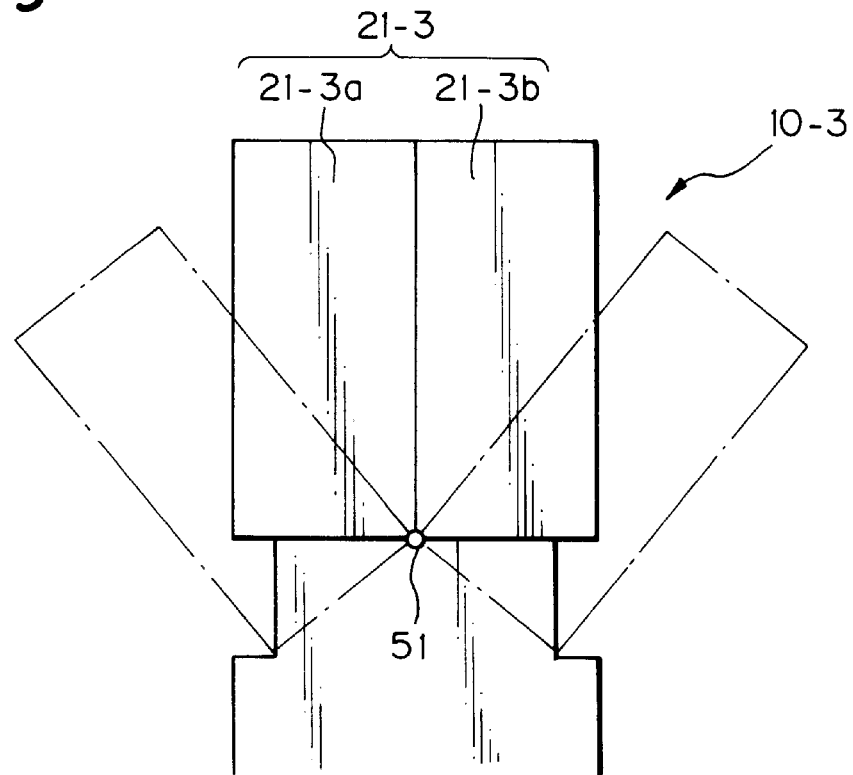
FIG. 5 is a view showing a dry/wet work turning-over machine according to a third embodiment of the present invention, where FIG. 5(*a*) is a front view of the dry/wet work turning-over machine and FIG. 5(*b*) is a schematic sectional view of the dry/wet work turning-over machine.
Figure 5B:
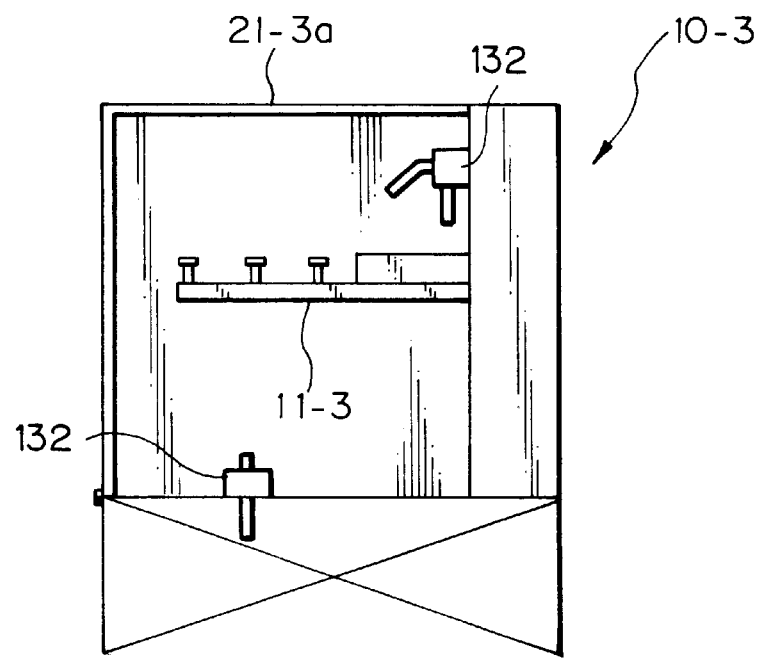

FIG. 5 is a view showing a dry/wet work turning-over machine according to a third embodiment of the present invention, where FIG. 5(a) is a front view of the dry/wet work turning-over machine and FIG. 5(b) is a schematic sectional view of the dry/wet work turning-over machine. In the dry/wet work turning-over machine 10-3, a work turning-over device 11-3 is surrounded by a water-proof cover 21-3 for preventing liquid from scattering therearound.

The water-proof cover 21-3 comprises a left water-proof cover half 21-3a and a right water-proof cover half 21-3b which are pivotally connected to each other by a lower central rotary shaft 51 to permit the halves to open leftwardly and rightwardly.

That is to say, when the left and right water-proof cover halves 21-3a, 21-3b are opened as shown by the dot and chain lines, a space immediately above the area into which the hand is inserted can be clear. The left and right water-proof cover halves 21-3a, 21-3b constitute an upper opening mechanism.

A rinse liquid supplying means 132 is disposed within the water-proof cover 21-3. Also in this embodiment, when the dry hand 257 is inserted into the predetermined area, the space immediately above such an area is completely clear (having no wall). Accordingly, the rinse liquid droplets adhered to the inner surface of the water-proof cover 21-3 do not drop onto the hand 257, and, thus, the hand can also be used as a wet hand.

In the embodiment shown in FIG. 5, while an example that the left and right water-proof cover halves 21-3a, 21-3b are pivotally connected to each other by the rotary shaft 51 to open the halves around the rotary shaft 51 was explained, for example, the left and right water-proof cover halves 21-3a, 21-3b may be translated in a left and right direction to open the halves or may be pivoted around another rotary shaft to open the halves.

Incidentally, also in this embodiment, it is not necessary for the left and right water-proof cover halves 21-3a, 21-3b to be opened to clear the entire area immediately above the entire upper surface of the hand 257, but the left and right water-proof cover halves 21-3a, 21-3b may be opened so as to clear at least an area immediately above the shift range through which the part of the hand 257 on which the semi-conductor wafer 100 is not rested is moved within the left and right water-proof cover halves 21-3a, 21-3b.

Fourth Embodiment

Figure 7A:
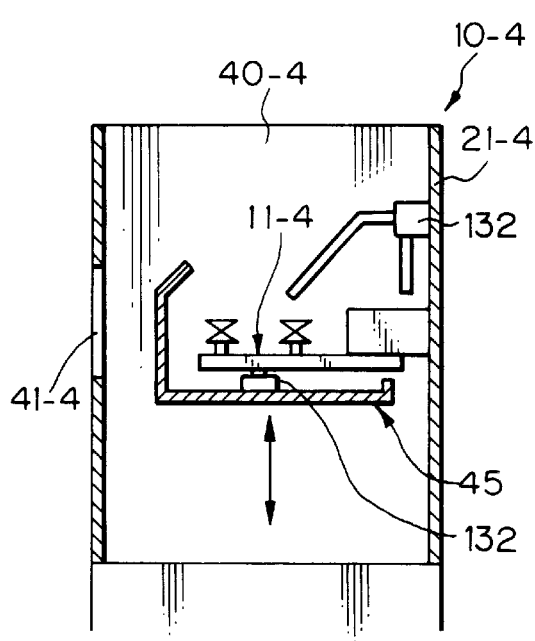
FIG. 7 is a view showing a dry/wet work turning-over machine according to a fourth embodiment of the present invention, where FIG. 7(*a*) is a schematic side sectional view of the dry/wet work turning-over machine and FIG. 7(*b*) is a schematic front sectional view of the dry/wet work turning-over machine.
Figure 7B:
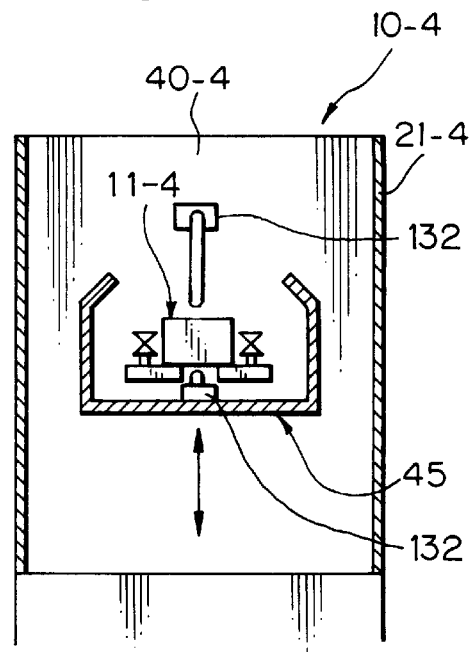

FIG. 7 is a view showing a dry/wet work turning-over machine according to a fourth embodiment of the present invention, where FIG. 7(a) is a schematic side sectional view of the dry/wet work turning-over machine and FIG. 7(b) is a schematic front sectional view of the dry/wet work turning-over machine. In the dry/wet work turning-over machine 10-4, a work turning-over device 11-4 is surrounded by a water-proof cover 21-4 for preventing liquid from scattering therearound.

As is in the water-proof cover 21-2 shown in FIG. 4, the water-proof cover 21-4 has an upper opening 40-4 at its top, and a hand insertion portion 41-4 comprised of a hole is formed in a front side of the water-proof cover 21-4.

In this embodiment, a cylindrical shield member 45 is disposed within the water-proof cover 21-4 for shifting movement in an up-and-down direction between a lifted position where the work turning-over device 11-4 is surrounded by the shield member 45 and a lowered retard position. Incidentally, a rinse liquid supplying means 132 is provided within the shield member 45.

Figure 8A:
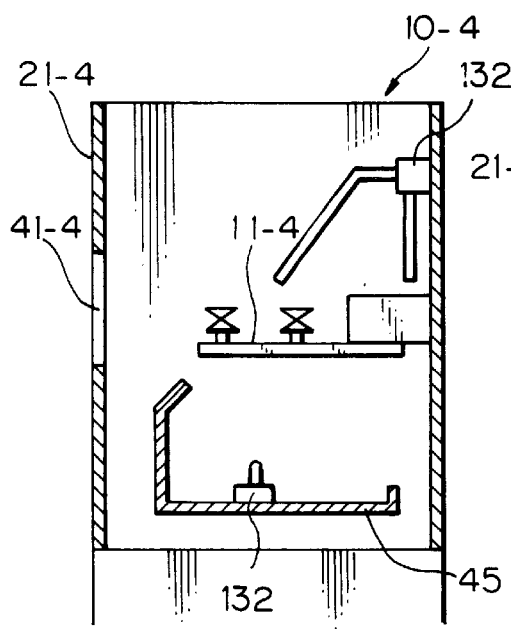
FIG. 8 is an explanatory view for explaining an operation of the dry/wet work turning-over machine 10-4, where FIG. 8(*a*) is a schematic side sectional view of the dry/wet work turning-over machine and FIG. 8(*b*) is a schematic front sectional view of the dry/wet work turning-over machine.
Figure 8B:
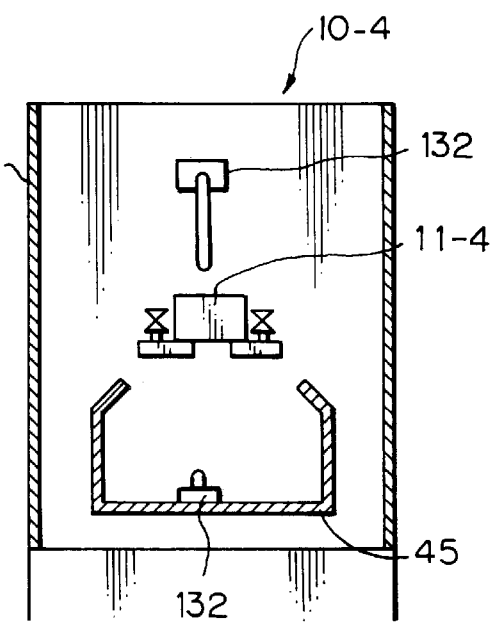

In the dry/wet work turning-over machine 10-4, as shown in FIG. 8, in a condition that the shield member 45 is lowered to the lowered position by a driving means (not shown), the semi-conductor wafer to which the abrasive liquid was adhered is inserted through the hand insertion portion 41-4 via the wet hand 256 (refer to FIG. 11) to transfer the wafer to the work turning-over device 11-4. After the hand 256 is retracted, the shield member 34 is lifted to the lifted position as shown in FIG. 7. In this condition, the semi-conductor wafer is rinsed while being turned over.

The rinse liquid scattering during the rinsing operation is shielded by the shield member 45, thereby preventing the rinse liquid from leaking out of the shield member 45.

Then, after the shield member 45 is lowered to the lowered position as shown in FIG. 8, the semi-conductor wafer is removed by inserting the hand 256 through the hand insertion portion 41-4.

Then, the hand 257 holding the fried semi-conductor wafer is inserted through the hand insertion portion 41-4 to transfer the wafer to the work turning-over device 11-4.

In this case, since the space above the hand 257 is completely clear, any rinse liquid does not drop onto the hand 257.

In this embodiment, due to the structure of the shield member 45, since the rinse liquid is not scattered to at least the hand insertion portion 41-4 of the water-proof cover 21-4 and therearound, there is no need for providing a shield member 43 as shown in FIG. 4 in the vicinity of the hand insertion portion 41-4. Of course, such a shield member 43 may be provided, if necessary.

The present invention is not limited to the above-mentioned embodiments, and various alterations may be effected, for example, as follows.

Figure 9A:
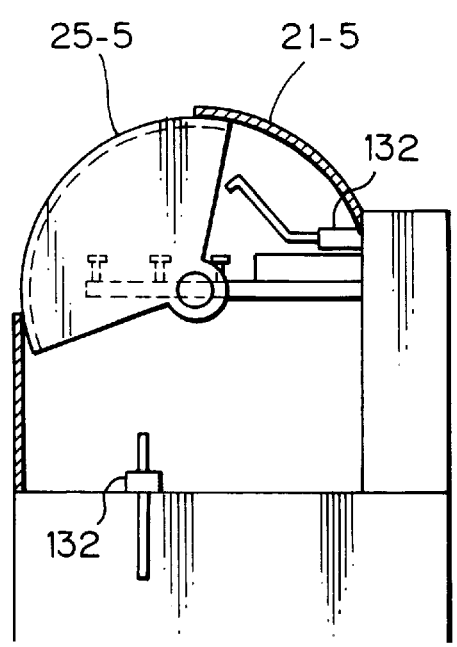
FIG. 9 is a view showing the other embodiments of the present invention, where FIG. 9(*a*) and FIG. 9(*b*) shows dry/wet work turning-over machine according to a fifth embodiment.
Figure 9B:
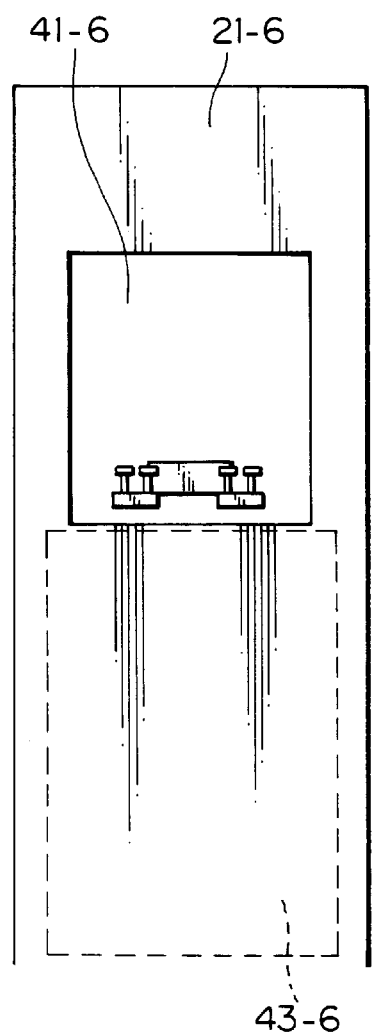

(1) As shown in FIG. 9(*a*), an upper portion of a water-proof cover 21-5 may be formed as an arcuate shape complementary to an arcuate screen 25-5. With this arrangement, the rinse liquid adhered to the water-proof cover 21-5 is apt to flow downwardly along the water-proof cover 21-5.

(2) As shown in FIG. 9(*b*), a hand insertion portion 41-6 of a water-proof cover 21-6 may be constituted by a rectangular hole in place of the notch (numbered by 41 in FIG. 4). In this case, a shield member 43-6 serves to prevent the rinse liquid from scattering to the hand insertion portion 41-6 and to the inner surface of the water-proof cover 21-6 around the hand insertion portion 41-6 (particularly, upper part of the inner surface above the hand insertion portion 41-6), thereby preventing the rinse liquid from dropping onto the hand.

(3) In the above-mentioned embodiments, while an example that the present invention is applied to the polishing apparatus was explained, the present invention can be applied to various work turning-over machines incorporated into any apparatus other than the polishing apparatus.

(4) The work turned over by the work turning-over machine is not limited to the semi-conductor wafer, but, LCD, a compact disc or the like may be handled as a work (Effect of the Invention)

As mentioned above, according to the present invention, there is obtained an excellent effect for providing a dry/wet work turning-over machine and a polishing apparatus having such a dry/wet work turning-over machine, in which, even when a dry hand is inserted after liquid such as rinse liquid was used within a water-proof cover, the liquid does not dropped onto the hand, and, thus, both dry work and wet work can be handled by a single machine.

What is claimed is:

1. A work turning-over machine having a turning-over device for transferring work between it and a hand of a robot which holds the work and for turning over the work, wherein:

said work turning-over device is surrounded by a water-proof cover for preventing scattering of liquid, said water-proof cover being provided with an upper opening mechanism so that, when said hand is inserted into said water-proof cover, at least an area immediately above a portion of said hand not covered by the work is opened, thereby preventing liquid droplets adhered to an inner surface of said water-proof cover from dropping onto said hand of said robot.

2. A work turning-over machine according to claim 1, wherein said upper opening mechanism includes an opening formed in said water-proof cover at an upper part of a front surface thereof and a front part of an upper surface thereof, a screen associated with said opening to open and close said opening, and an open/close driving mechanism associated with said screen and adapted to open said opening of said water-proof cover by shifting said screen.

3. A work turning-over machine according to claim 2, wherein, when said opening is closed by said screen, an upper end portion of said screen is entered into said water-proof cover to provide an overlap portion, and further wherein said hand is inserted into said water-proof cover through said opening opened by shifting said screen in such a manner that a tip end of said hand reaches a position immediately below said overlap portion between said water-proof cover and said screen.

4. A work turning-over machine according to claim 1, wherein said upper opening mechanism includes left and right water-proof cover halves which can be split so as to open said left and right water-proof cover halves leftwardly and rightwardly, thereby opening said area.

5. A work turning-over machine having a work turning-over device for transferring work between it and a hand of a robot which holds the work and for turning over the work, wherein:

said work turning-over device is surrounded by a water-proof cover for preventing scattering of liquid, said water-proof cover being provided at its top with an upper opening and also being provided with a hand insertion portion constituted by a hole or notch through which said hand is inserted, and further comprising a shield member disposed within said water-proof cover and supported for vertical movement between a lifted position where said shield member prevents the liquid from scattering toward said hand insertion portion and therearound and a lowered position.

6. A polishing apparatus comprising:

a top ring for holding work;

a turn table having a polishing surface for polishing a surface of the work held by said top ring;

a robot having a hand for transferring the work; and a turning-over machine according to claim 1 for transferring the work between it and said hand and for turning over the work.

7. A work turning-over machine comprising:

a work turning-over device for turning over a work;

a rinsing device for rinsing the work held by said work turning-over device; and a cover for covering said work turning-over device to prevent rinsing liquid from being scattered;

wherein when a hand of a robot for carrying the work is inserted into said cover and the work is transferred between said work turning-over device and said hand, at least an area above a portion of said hand which is not covered by the work is open.

8. A polishing apparatus comprising:

a top ring for holding work;

a turn table having a polishing surface for polishing a surface of the work held by said top ring;

a robot having a hand for transferring the work; and a turning-over machine according to claim 2 for transferring the work between it and said hand for turning over the work.

9. A polishing apparatus comprising:

a top ring for holding work;

a turn table having a polishing surface for polishing a surface of the work held by said top ring;

a robot having a hand for transferring the work; and a turning-over machine according to claim 3 for transferring the work between it and said hand for turning over the work.

10. A polishing apparatus comprising:

a top ring for holding work;

a turn table having a polishing surface for polishing a surface of the work held by said top ring;

a robot having a hand for transferring the work; and a turning-over machine according to claim 4 for transferring the work between it and said hand for turning over the work.

11. A polishing apparatus comprising:

a top ring for holding work;

a turn table having a polishing surface for polishing a surface of the work held by said top ring;

a robot having a hand for transferring the work; and a turning-over machine according to claim 5 for transferring the work between it and said hand for turning over the work.

* * * * *